United States Patent
Liu et al.

(10) Patent No.: US 10,266,395 B2
(45) Date of Patent: Apr. 23, 2019

(54) SEMICONDUCTIVE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yen-Cheng Liu, New Taipei (TW); Hsin-Ting Huang, Taoyuan County (TW); Shang-Ying Tsai, Taoyuan County (TW); Kuei-Sung Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 392 days.

(21) Appl. No.: 14/832,264

(22) Filed: Aug. 21, 2015

(65) Prior Publication Data
US 2017/0050841 A1    Feb. 23, 2017

(51) Int. Cl.
*B81B 7/00* (2006.01)
*B81B 7/02* (2006.01)
*B81B 3/00* (2006.01)
*B81C 1/00* (2006.01)

(52) U.S. Cl.
CPC ............ *B81B 7/007* (2013.01); *B81B 3/0005* (2013.01); *B81B 7/02* (2013.01); *B81C 1/00269* (2013.01); *B81B 2201/0235* (2013.01); *B81B 2201/0242* (2013.01); *B81C 2201/112* (2013.01)

(58) Field of Classification Search
CPC ....................................................... B81B 7/00
See application file for complete search history.

(56) References Cited

U.S. PATENT DOCUMENTS

| 2012/0043627 | A1* | 2/2012 | Lin ........................... | B81B 7/02 257/415 |
| 2012/0326248 | A1* | 12/2012 | Daneman .................. | B81B 7/02 257/415 |

OTHER PUBLICATIONS

Hsin-Ting Huang, U.S. Appl. No. 14/557,513 (not yet published), filed Dec. 2, 2014.

* cited by examiner

*Primary Examiner* — Marvin Payen
(74) *Attorney, Agent, or Firm* — WPAT, P.C., Intellectual Propery Attorneys; Anthony King

(57) ABSTRACT

A semiconductive structure includes a first substrate including a first surface and a second surface opposite to the first surface, a second substrate disposed over the first surface and including a first device and a second device, a first capping structure disposed over the second substrate, and including a via extending through the first capping structure to the second device, a first cavity surrounding the first device and defined by the first capping structure and the first substrate, a second cavity surrounding the second device and defined by the first capping structure and the first substrate, and a second capping structure disposed over the first capping structure and covering the via, wherein the second cavity and the via are sealed by the second capping structure.

20 Claims, 9 Drawing Sheets

SEMICONDUCTIVE STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes mechanical and electrical features formed by one or more semiconductor manufacturing processes. The MEMS device includes fabrication using semiconductive materials to form mechanical and electrical features. For many applications, MEMS device is electrically connected to external circuitry to form complete MEMS systems. Commonly, the connections are formed by wire bonding. The MEMS device may include a number of elements (e.g., stationary or movable elements) for achieving electro-mechanical functionality. MEMS devices are widely used in various applications. MEMS applications include pressure sensors, printer nozzles, or the like. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. The devices involve many complicated steps and increases complexity of manufacturing. The increase in complexity of manufacturing may cause deficiencies such as high yield loss, warpage, low signal to noise ratio (SNR), etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
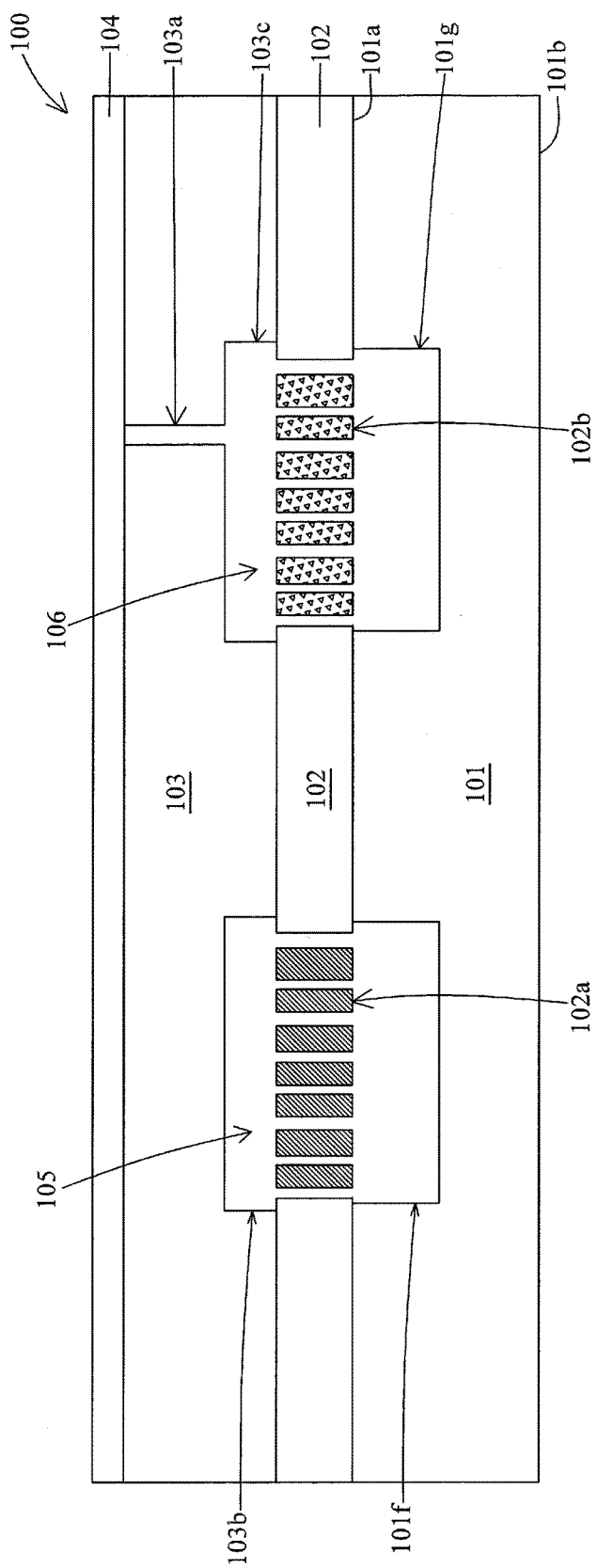
FIG. 1 is a schematic cross-sectional view of a semiconductive structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multiple MEMS devices can be integrated onto a semiconductive chip in recent generation of MEMS applications. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement, and the gyroscope detects angular movement. To meet consumer's demand for low cost, high quality, and small device footprint, the accelerometer and the gyroscope can be formed from MEMS devices, which are integrated together on a same substrate by same manufacturing processes. However, the accelerometer and the gyroscope utilize different operating conditions. For example, the gyroscope is often packaged in a vacuum for optimal performance. In contrast, the accelerometer is often packaged at a predetermined pressure to produce a smooth frequency response.

Therefore, the present disclosure is directed to a semiconductive structure including multiple devices that are integrated on a substrate. The semiconductive structure includes a substrate, a first capping structure and a second capping structure. The substrate includes a first device and a second device and bonds with the first capping structure. As such, the first device and the second device are disposed within a first cavity and a second cavity respectively. The first capping structure includes a via extending through the first capping structure to the second cavity. The second cavity is sealed by disposing the second capping structure over the first capping structure and the via. The sealing of the second cavity by the second capping structure is independent from shape or dimension of the via. In other words, the via in any shape or dimension can be covered by the second capping structure to seal the second cavity. Other embodiments are also disclosed.

Furthermore, the arrangement of the via in the first capping structure allows the second cavity at a second gas pressure different from a first gas pressure in the first cavity. After bonding of the first substrate with the second substrate, the first device and the second device are under the same first gas pressure. The formation of the via after the bonding penults adjustment or change of the second gas pressure different from the first gas pressure or other predetermined gas pressures For example, the first cavity and the second cavity are in vacuum after the bonding, and the second gas pressure is adjusted to 1 atmospheric pressure (ambient environment) by the via after disposing the second capping structure. Thus, the first device and the second device are operated under their optimal conditions respectively. The performances of the first device and the second device would be optimized. The performance of the semiconductive structure is improved. Other embodiments are also disclosed.

FIG. 1 illustrates a schematic cross sectional view of a semiconductive structure 100 in accordance with some embodiments of the present disclosure. The semiconductive structure 100 includes a first substrate 101, a second substrate 102, a first capping structure 103 and a second capping structure 104. In some embodiments, the semiconductive structure 100 is configured for sensing movement, pressure or etc. In some embodiments, the semiconductive structure 100 is configured for sensing linear motion and angular motion. In some embodiments, the semiconductive structure 100 includes one or more sensing devices. In some embodiments, the semiconductive structure 100 is in dual or multiple gas pressures, as the sensing devices are operated under more than one gas pressures.

In some embodiments, the semiconductive structure 100 includes the first substrate 101. In some embodiments, the first substrate 101 includes a first surface 101a and a second surface 101b opposite to the first surface 101a. In some embodiments, the first substrate 101 includes a first recess 101f and a third recess 101g. In some embodiments, the first recess 101f or the third recess 101g is disposed over the first surface 101a and extended towards the second surface 101b.

In some embodiments, the first substrate 101 includes several circuitries and one or more active elements such as transistors etc. disposed over or in the first substrate 101. In some embodiments, the circuitries formed over or in the first substrate 101 may be any type of circuitry suitable for a particular application. In accordance with some embodiments, the circuitries may include various n-type metal-oxide semiconductor (NMOS) and/or p-type metal-oxide semiconductor (PMOS) devices such as transistors, capacitors, resistors, diodes, photo-diodes, fuses and/or the like. The circuitries may be interconnected to perform one or more functions. In some embodiments, the first substrate 101 includes CMOS components disposed over or in the first substrate 101. In some embodiments, the first substrate 101 includes semiconductive materials such as silicon or other suitable materials. In some embodiments, the first substrate 101 is a silicon substrate. In some embodiments, the first substrate 101 is a CMOS substrate.

In some embodiments, the semiconductive structure 100 includes the second substrate 102 disposed over the first surface 101a of the first substrate 101. In some embodiments, the second substrate 102 is bonded with the first substrate 101. In some embodiments, the second substrate 102 includes semiconductive material. In some embodiments, the second substrate 102 includes same material that is used for the first substrate 101. In some embodiments, the second substrate 102 includes material different from that of the first substrate 101. In some embodiments, the second substrate 102 includes silicon or other suitable materials. In some embodiments, the second substrate 102 includes electrical circuits formed over or in the second substrate 102. In some embodiments, the second substrate 102 includes transistors, capacitors, resistors, diodes, photo-diodes and/or the like. In some embodiments, the second substrate 102 is a MEMS substrate including electro-mechanical elements.

In some embodiments, the second substrate 102 includes a first device 102a and a second device 102b. In some embodiments, the first device 102a and the second device 102b are MEMS devices. In some embodiments, the first device 102a or the second device 102b includes, for example, a microphone, a gas pressure sensor, an accelerometer, a gyroscope, a magnetometer, resonator or any other device that interfaces with the external environment. In some embodiments, the first device 102a is a gyroscope for measuring angular velocity. In some embodiments, the second device 102b is an accelerometer for measuring linear acceleration. In some embodiments, the first device 102a and the second device 102b are cooperated to be a motion sensor. For example, the first device 102a and the second device 102b are configured for a motion-activated user interface or for an automotive crash detection system. In some embodiments, the first device 102a or the second device 102b is movable relative to the first substrate 101 or the second substrate 102.

In some embodiments, the first device 102a is disposed over the first recess 101f, and the second device 102b is disposed over the third recess 101g. Thus, the first device 102a and the second device 102b are spaced from the first substrate 101. In some embodiments, the first device 102a is movable within the first recess 101f and relative to the first substrate 101. In some embodiments, the second device 102b is movable within the third recess 101g and relative to the first substrate 101.

In some embodiments, the semiconductive structure 100 includes a first capping structure 103 disposed over the second substrate 102. In some embodiments, the first capping structure 103 is bonded over the second substrate 102. In some embodiments, the first capping structure 103 includes silicon or other suitable materials. In some embodiments, the first capping structure 103 includes a via 103a, a second recess 103b and a fourth recess 103c. In some embodiments, the second recess 103b is disposed over the first device 102a and the first recess 101f. In some embodiments, the fourth recess 103c is disposed over the second device 102b and the third recess 101g. In some embodiments, the via 103a is configured to access the fourth recess 103c, the second device 102b and the third recess 101g.

In some embodiments, the via 103a is extended through the first capping structure 103 to the second device 102b. In some embodiments, the via 103a is extended from a sidewall of the fourth recess 103c. In some embodiments, the via 103a is configured to access the second device 102b and the third recess 101g. In some embodiments, the via 103a is vertically coupled with the third recess 103c. In some embodiments, the via 103a permits a passage of material such as gas. In some embodiments, the via 103a is in various configurations, such as stepped, staggered, tapered configurations or etc. In some embodiments, the via 103a has a cross sectional area in various shape such as circular, rectangular, quadrilateral, polygonal or etc. In some embodiments, the via 103a has a depth of about 50 um to about 250 um.

In some embodiments, the semiconductive structure 100 includes a first cavity 105 and a second cavity 106. In some embodiments, the first cavity 105 and the second cavity 106 are formed by cooperation of the first substrate 101 and the first capping structure 103. In some embodiments, the first cavity 105 is hermetically isolated from the second cavity 106. In some embodiments, the first cavity 105 surrounds the first device 102a and defined by the first capping structure 103 and the first substrate 101. In some embodiments, the first cavity 105 is defined by the first recess 101f of the first substrate 101 and the second recess 103b of the first capping structure 103. In some embodiments, the first device 102a is movable within the first cavity 105. In some embodiments, the second cavity 106 surrounds the second device 102b and defined by the first capping structure 103 and the first substrate 101.

In some embodiments, the second cavity 106 is defined by the third recess 101g of the first substrate 101 and the fourth recess 103c of the first capping structure 103. In some embodiments, the second device 102b is movable within the second cavity 106. In some embodiments, the via 103a is coupled with the second cavity 106 and is configured to access the second cavity 106.

In some embodiments, the semiconductive structure 100 includes the second capping structure 104 disposed over the first capping structure 103 and covering the via 103a. In some embodiments, the second capping structure 104 is conformal to a surface of the first capping structure 103. In some embodiments, the second capping structure 104 is bonded with the first capping structure 103. In some embodiments, the second capping structure 104 is disposed over the first capping structure 103 to seal the second cavity 106 and the via 130a. In some embodiments, the second capping structure 104 includes a protrusion configured to be inserted into the via 103a. In some embodiments, the second capping structure 104 is a substrate or wafer. In some embodiments, the second capping structure 104 includes semiconductive material or other suitable material. In some embodiments, the second capping structure 104 is a silicon substrate. In some embodiments, the second capping structure 104 has a thickness of about 10 um.

In some embodiments, a first gas pressure is established in the first cavity 105 by the cooperation of the first substrate 101 and the first capping structure 103. In some embodiments, the first cavity 105 is at the first gas pressure. In some embodiments, the first device 102a is under the first gas pressure in the first cavity 105. In some embodiments, the first gas pressure is lower than an atmospheric pressure or a pressure of an ambient environment. In some embodiments, the first cavity 105 is in a vacuum or high vacuum that the first gas pressure in the first cavity 105 is lower than the atmospheric pressure (1 atm). In some embodiments, the first cavity 105 is in a high vacuum in order to optimize the performance of the first device 102a.

In some embodiments, a second gas pressure is established in the second cavity 106 by the arrangement of the via 103a and the second capping structure 104. Since the via 103a allows passage of gas between the second cavity 106 and the surroundings or ambient environment before disposing the second capping structure 104 over the first capping structure 103, the second cavity 106 is at the second gas pressure different from the first gas pressure at the first cavity 105. In some embodiments, the second gas pressure is substantially greater than the first gas pressure. In some embodiments, the second cavity 106 is at the second gas pressure of about 1 atm, an ambient environment or other predetermined gas pressure after sealing the second cavity 106 by the second capping structure 104. In some embodiments, the second cavity 106 is in 1 atm in order to optimize the performance of the second device 102b.

In some embodiments, the second device 102b is coated by an anti-stiction coating such as self-assembled monolayer (SAM) coating to prevent or minimize stiction between the second device 102b and the first substrate 101 or the first capping structure 103. In some embodiments, the via 103a permit a passage of the anti-stiction coating. In some embodiments, the via 103a allows the anti-stiction coating entering into the second cavity 106 to coat the second device 102b before disposing the second capping structure 104 over the first capping structure 103.

Figure 2:
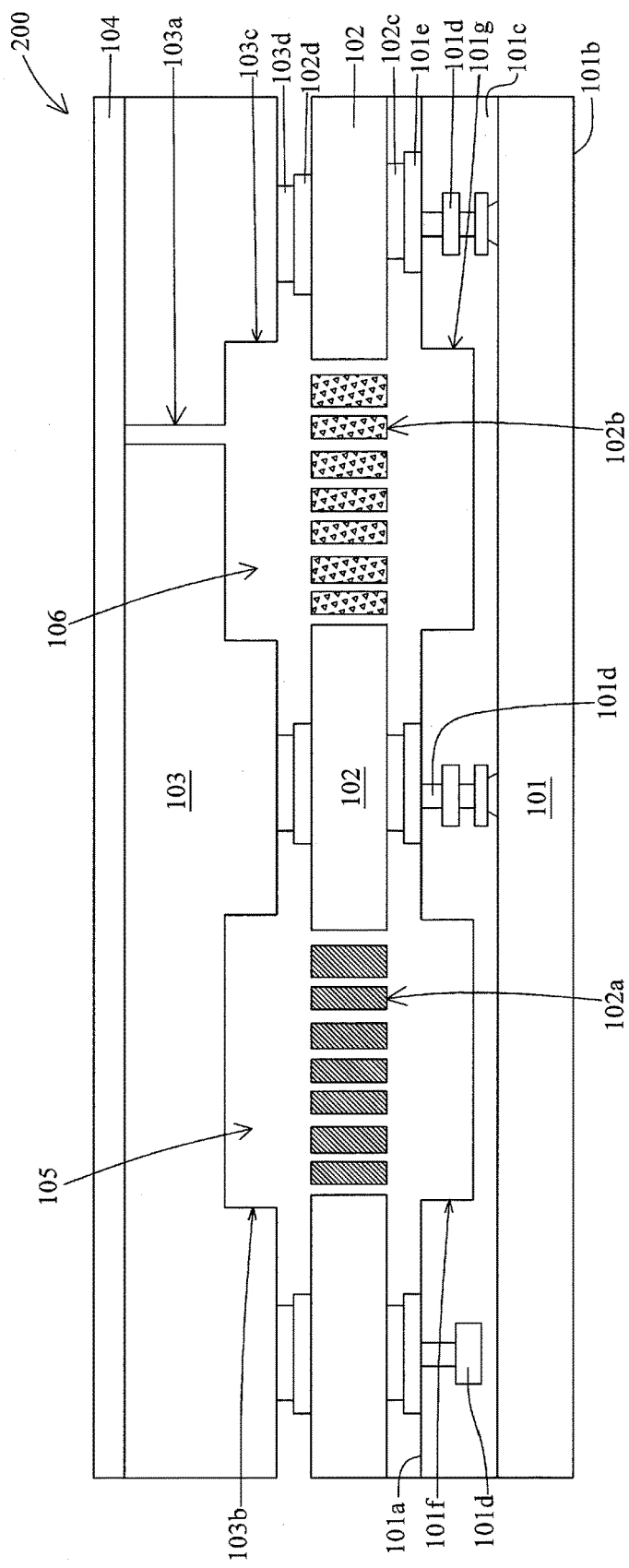
FIG. 2 is a schematic cross-sectional view of a semiconductive structure in accordance with some embodiments of the present disclosure.

FIG. 2 illustrates a schematic cross sectional view of a semiconductive structure 200 in accordance with some embodiments of the present disclosure. In some embodiments, the semiconductive structure 200 is configured for sensing movement, pressure or etc. In some embodiments, the semiconductive structure 100 is configured for sensing linear motion and angular motion. In some embodiments, the semiconductive structure 200 includes a CMOS substrate 101, a MEMS substrate 102, a capping structure 103 and a silicon substrate 104.

In some embodiments, the CMOS substrate 101 has similar configuration as the first substrate 101 described above. In some embodiments, the CMOS substrate 101 includes an intermetallic dielectric (IMD) layer 101c. In some embodiments, a conductive structure 101d is disposed within the IMD layer 101c. In some embodiments, the conductive structure 101d is surrounded by dielectric material such as oxide, etc. and is electrically connected with a circuitry or element in the CMOS substrate 101. In some embodiments, the conductive structure 101d includes tungsten, copper, aluminum, etc.

In some embodiments, a first bonding pad 101e is disposed over the CMOS substrate 101 or the IMD layer 101c. In some embodiments, the first bonding pad 101e is configured to receive with external conductive structure. In some embodiments, the first bonding pad 101e is electrically connected with the conductive structure 101d in the CMOS substrate 101. In some embodiments, the first bonding pad 101e includes aluminum, copper, titanium, gold, nickel or other suitable materials.

In some embodiments, the MEMS substrate 102 has similar configuration as the second substrate 102 described above. In some embodiments, the MEMS substrate 102 includes a first MEMS device 102a and a second MEMS device 102b, which have similar configurations as the first device 102a and the second device 102b described above respectively. In some embodiments, the MEMS substrate 102 is disposed over the CMOS substrate 101.

In some embodiments, the MEMS substrate 102 includes a second bonding pad 102c. In some embodiments, the second bonding pad 102c is configured to receive external conductive structure. In some embodiments, the second bonding pad 102c is disposed opposite to the first bonding pad 101e. In some embodiments, the MEMS substrate 102 is bonded over the CMOS substrate 101 by bonding the first bonding pad 101e with the second bonding pad 102c. As such, the CMOS substrate 101 is electrically connected with the MEMS substrate 102 through the first bonding pad 101e and the second bonding pad 102c. In some embodiments, the first bonding pad 101e is eutectically bonded with the second bonding pad 102c. In some embodiments, the second bonding pad 102c includes germanium, silicon or other suitable materials.

In some embodiments, the MEMS substrate 102 includes a third bonding pad 102d disposed opposite to the second bonding pad 102c. In some embodiments, the third bonding pad 102d is configured to receive external conductive structure. In some embodiments, the third bonding pad 102d includes aluminum, copper or other suitable materials.

In some embodiments, the capping structure 103 has similar configuration as the first capping structure 103 described above. In some embodiments, the capping structure 103 is disposed over the MEMS substrate 102. In some embodiments, the capping structure 103 includes a via 103a extending through the capping structure 103 and disposed over the second MEMS device 102b. In some embodiments, the via 103a has similar configuration as the via 103a described above. In some embodiments, the capping structure 103 includes a fourth bonding pad 103d configured to receive external conductive structure. In some embodiments, the fourth bonding pad 103d is disposed opposite to the third bonding pad 102d. In some embodiments, the capping structure 103 is bonded over the MEMS substrate 102 by bonding the third bonding pad 102d with the fourth bonding pad 103d. In some embodiments, the fourth bonding pad 103d includes aluminum, copper or other suitable materials.

In some embodiments, the silicon substrate 104 has similar configuration as the second capping structure 104 described above. In some embodiments, the silicon substrate 104 is disposed over the capping structure 103. In some embodiments, the silicon substrate 104 is disposed conformally to the capping structure 103 and over the first MEMS device 102a and the second MEMS device 102b. In some embodiments, the silicon substrate 104 has a length substantially same as a length of the capping structure 103.

In some embodiments, the via 103a is covered by the silicon substrate 104 to seal the second MEMS device 102b. In some embodiments, the first MEMS device 102a is under a first gas pressure, and the second MEMS device 102b is under a second gas pressure different from the first gas pressure. In some embodiments, the first MEMS device 102a is sealed at the first gas pressure by bonding the CMOS substrate 101, the MEMS substrate 102 and the capping structure 103. In some embodiments, the first MEMS device 102a is sealed by bonding the first bonding pad 101e with the second bonding pad 102c and bonding the third bonding pad 102d with the fourth bonding pad 103d. In some embodiments, the first MEMS device 102a is operated under the first gas pressure. In some embodiments, the first MEMS device 102a is under a vacuum that the first gas pressure is substantially smaller than an atmospheric pressure or a gas pressure of an ambient environment.

In some embodiments, the second MEMS device 102b is sealed at the second gas pressure which is different from the first gas pressure. In some embodiments, the second MEMS device 102b is sealed by disposing the silicon substrate 104 over the capping structure 103 and covering the via 103a. Since the via 103a allows passage of gas before disposing the silicon substrate, the second MEMS device 102b can be sealed at the second gas pressure different from the first gas pressure upon deposition of the silicon substrate 104. In some embodiments, the second MEMS device 102b is sealed at about 1 atm or under the ambient environment, such that the second MEMS device 102b is operated under the second gas pressure of about 1 atm.

In the present disclosure, a method of manufacturing a semiconductive structure is also disclosed. In some embodiments, a semiconductive structure is formed by a method 300. The method 300 includes a number of operations and the description and illustration are not deemed as a limitation as the sequence of the operations.

Figure 3:
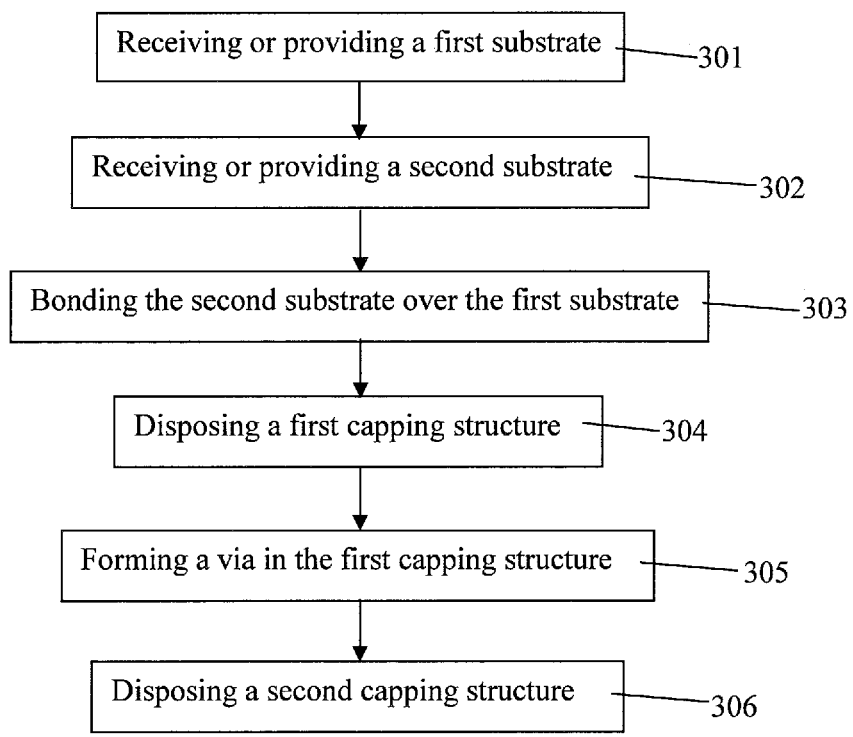
FIG. 3 is a flow diagram of a method of manufacturing a semiconductive structure in accordance with some embodiments of the present disclosure.

FIG. 3 is an embodiment of a method 300 of manufacturing a semiconductive structure. The method 300 includes a number of operations (301, 302, 303, 304, 305 and 306).

Figure 3A:
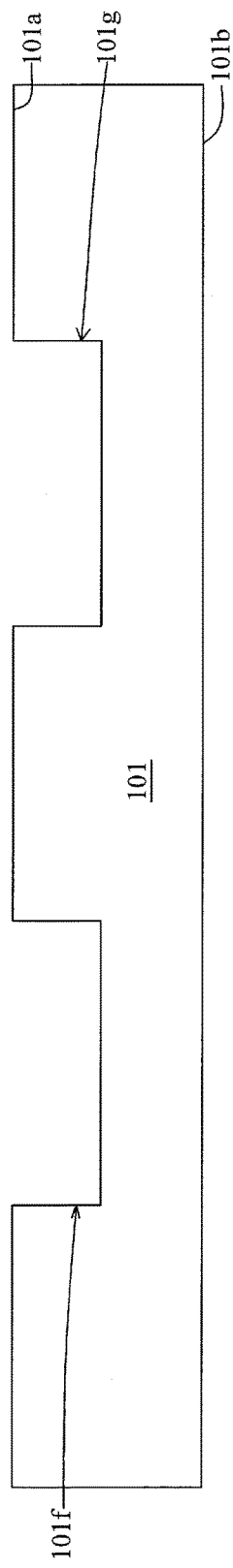
FIG. 3A is a schematic cross-sectional view of a first substrate in accordance with some embodiments of the present disclosure.
Figure 3B:
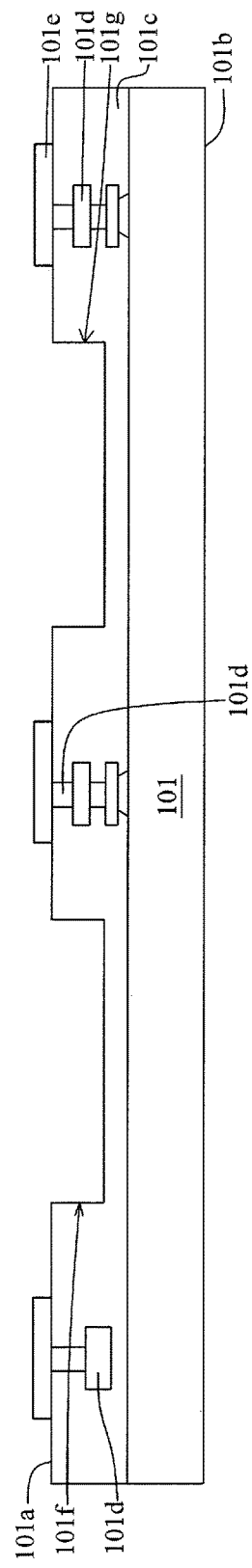
FIG. 3B is a schematic cross-sectional view of a first substrate with an intermetallic dielectric layer in accordance with some embodiments of the present disclosure.

In operation 301, a first substrate 101 is received or provided as shown in FIG. 3A or 3B. In some embodiments, the first substrate 101 includes a first surface 101a and a second surface 101b opposite to the first surface 101a. In some embodiments, the first substrate 101 includes several circuitries and one or more active elements such as transistors etc. disposed over or in the first substrate 101. In some embodiments, the first substrate 101 includes CMOS components disposed over or in the first substrate 101. In some embodiments, the first substrate 101 includes semiconductive materials such as silicon or other suitable materials. In some embodiments, the first substrate 101 is a silicon substrate. In some embodiments, the first substrate 101 is a CMOS substrate.

In some embodiments, the first substrate 101 includes a first recess 101f and a third recess 101g. In some embodiments, some portions of the first substrate 101 are removed to form the first recess 101f and the third recess 101g. In some embodiments, the first recess 101f and the third recess 101g are formed by photolithography and etching or other suitable operations. In some embodiments, the first recess 101f and the third recess 101g are formed simultaneously or separately. In some embodiments, the first recess 101f has similar or different dimension and shape as or from the third recess 101g.

In some embodiments as shown in FIG. 3B, the first substrate 101 includes an intermetallic dielectric (IMD) layer 101c. In some embodiments, the IMD layer 101c is formed by chemical vapor deposition (CVD) or other suitable operations. In some embodiments, a conductive structure 101d is disposed within the IMD layer 101c. In some embodiments, the conductive structure 101d is surrounded by dielectric material and is electrically connected with a circuitry or element in the first substrate 101. In some embodiments, the first recess 101f and the third recess 101g are extended within the IMD layer 101c. In some embodiments, the conductive structure 101d is disposed adjacent to the first recess 101f or the third recess 101g.

In some embodiments, a first bonding pad 101e is disposed over the IMD layer 101c. In some embodiments, the first bonding pad 101e is disposed over and electrically connected with the conductive structure 101d. In some embodiments, the first bonding pad 101e is formed by sputtering, electroplating or other suitable operations. In some embodiments, the first bonding pad 101e is configured to receive an interconnect structure or electrically connect with external circuitry or conductive element.

Figure 3C:
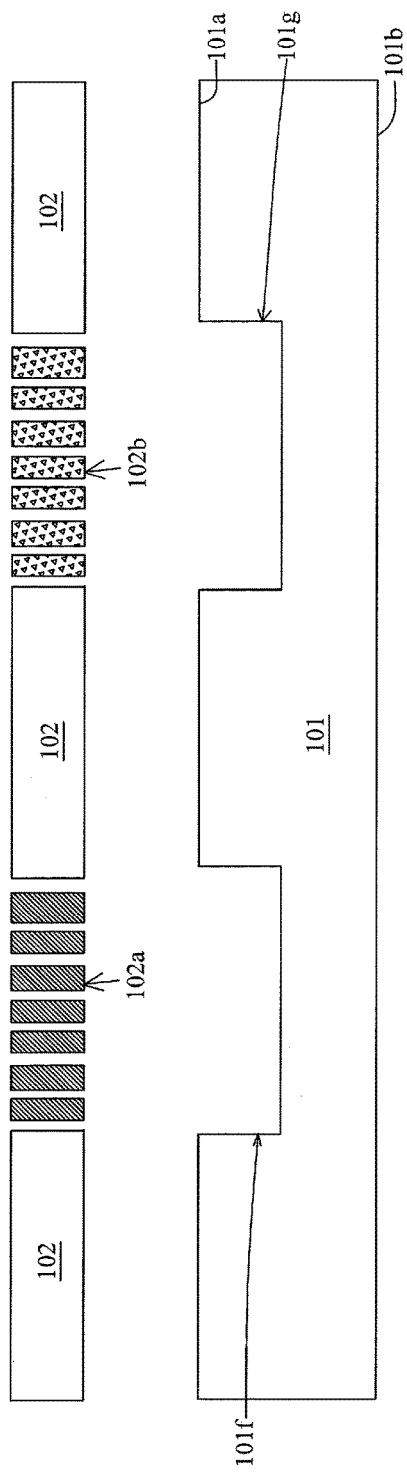
FIG. 3C is a schematic cross-sectional view of a second substrate in accordance with some embodiments of the present disclosure.
Figure 3D:
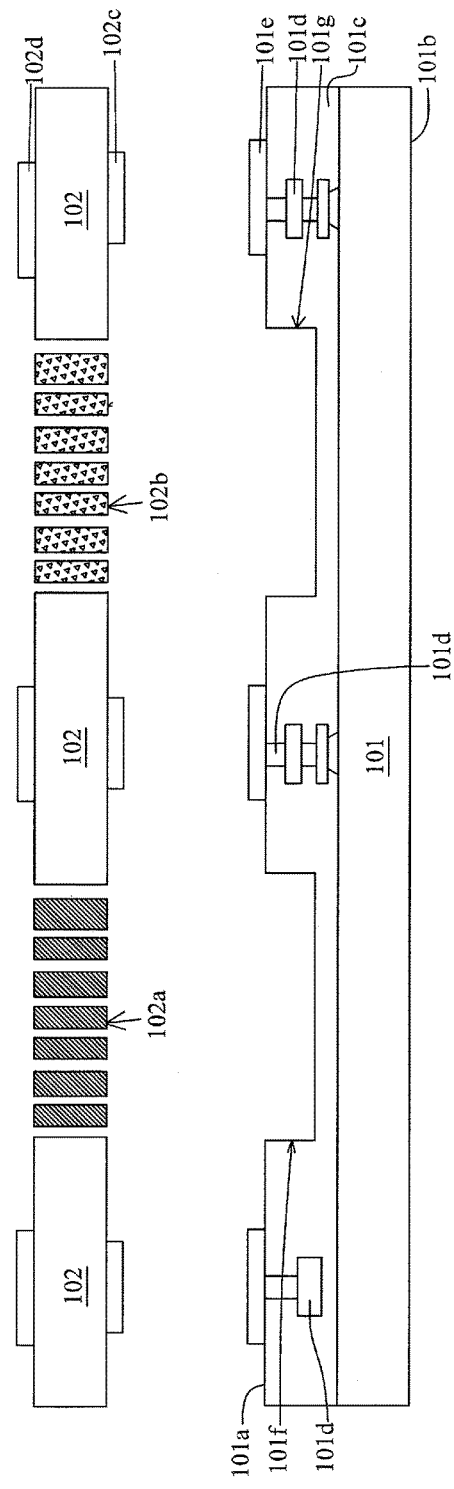
FIG. 3D is a schematic cross-sectional view of a second substrate with a bonding pad in accordance with some embodiments of the present disclosure.

In operation 302, a second substrate 102 is received or provided as shown in FIG. 3C or 3D. In some embodiments, the second substrate 102 includes semiconductive material. In some embodiments, the second substrate 102 includes silicon or other suitable materials. In some embodiments, the second substrate 102 includes electrical circuits formed over or in the second substrate 102. In some embodiments, the second substrate 102 is a MEMS substrate including electro-mechanical elements.

In some embodiments, the second substrate 102 includes a first device 102a and a second device 102b. In some embodiments, the first device 102a and the second device 102b are MEMS devices. In some embodiments, the first device 102a is a gyroscope for measuring angular velocity. In some embodiments, the second device 102b is an accelerometer for measuring linear acceleration.

In some embodiments as shown in FIG. 3D, the second substrate 102 includes a second bonding pad 102c and a third bonding pad 102d. In some embodiments, the second bonding pad 102c is disposed opposite to the third bonding pad 102d. In some embodiments, the second bonding pad 102c faces to the first bonding pad 101e. In some embodiments, the second bonding pad 102c is configured to receive the first bonding pad 101e. In some embodiments, the third bonding pad 102d is configured to receive an interconnect structure or electrically connect with external circuitry or conductive element. In some embodiments, the second bonding pad 102c and the third bonding pad 102d are formed by electroplating, sputtering or other suitable operations.

Figure 3E:
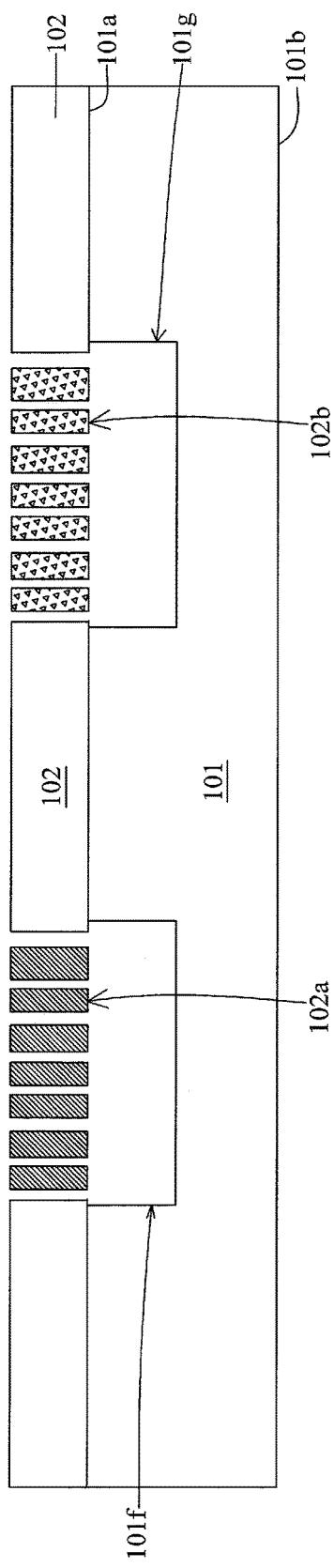
FIG. 3E is a schematic cross-sectional view of a second substrate bonded with a first substrate in accordance with some embodiments of the present disclosure.
Figure 3F:
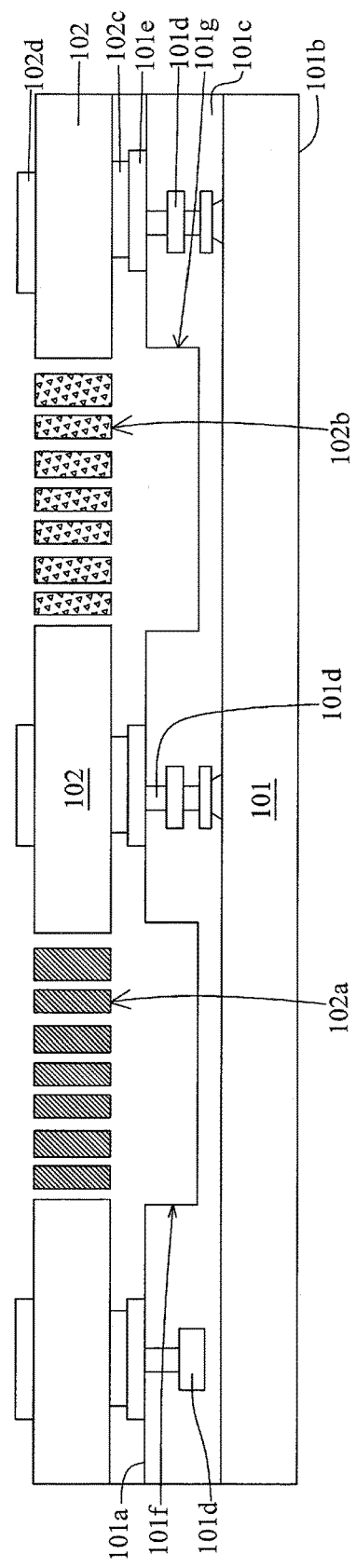
FIG. 3F is a schematic cross-sectional view of a second substrate bonded with a first substrate by a bonding pad in accordance with some embodiments of the present disclosure.

In operation 303, the second substrate 102 is bonded over the first substrate 101 as shown in FIG. 3E or 3F. In some embodiments, the second substrate 102 is disposed over and bonded with the first substrate 101. In some embodiments, the second substrate 102 is bonded with the first substrate 101 by fusion bonding, eutectic bonding or other suitable operations. In some embodiments, the second substrate 102 is bonded with the first substrate 101 through the first bonding pad 101e and the second bonding pad 102c.

In some embodiments as shown in FIG. 3F, the first bonding pad 101e is bonded with the second bonding pad 102c, such that a circuitry of the second substrate 102 is electrically connected with a circuitry of the first substrate 101. In some embodiments, the first bonding pad 101e is eutectically bonded with the second bonding pad 102c.

In some embodiments, the first device 102a of the second substrate 102 is disposed over the first recess 101f of the first substrate 101, and the second device 102b of the second substrate 102 is disposed over the third recess 101g of the first substrate 101. In some embodiments, the first device 102a and the second device 102b are aligned with the first recess 101f and the third recess 101g respectively. In some embodiments, the first device 102a and the second device 102b are movable relative to the first recess 101f and the third recess 101g respectively.

Figure 3G:
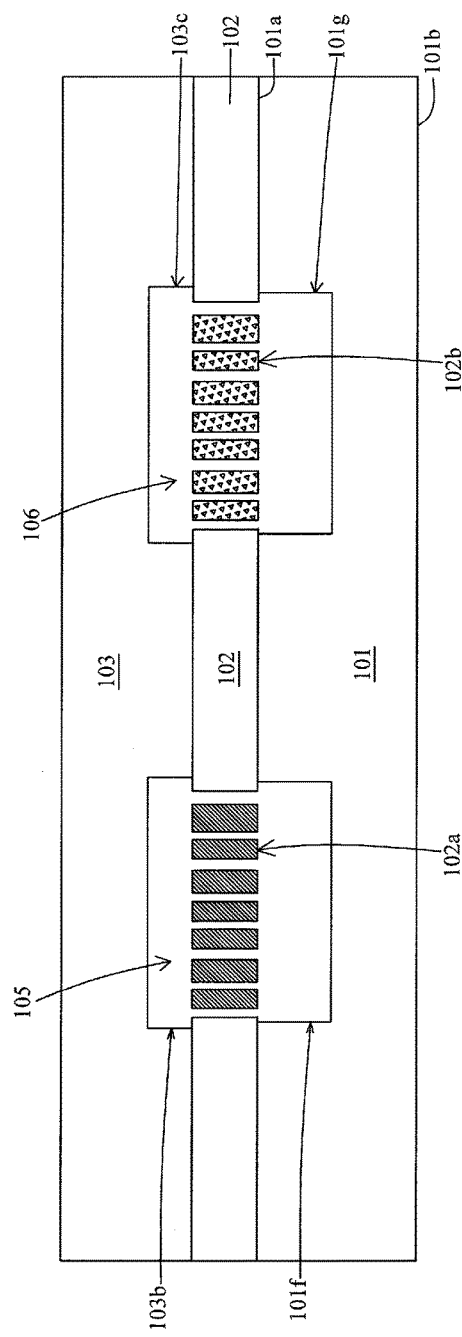
FIG. 3G is a schematic cross-sectional view of a first capping structure bonded with a second substrate in accordance with some embodiments of the present disclosure.
Figure 3H:
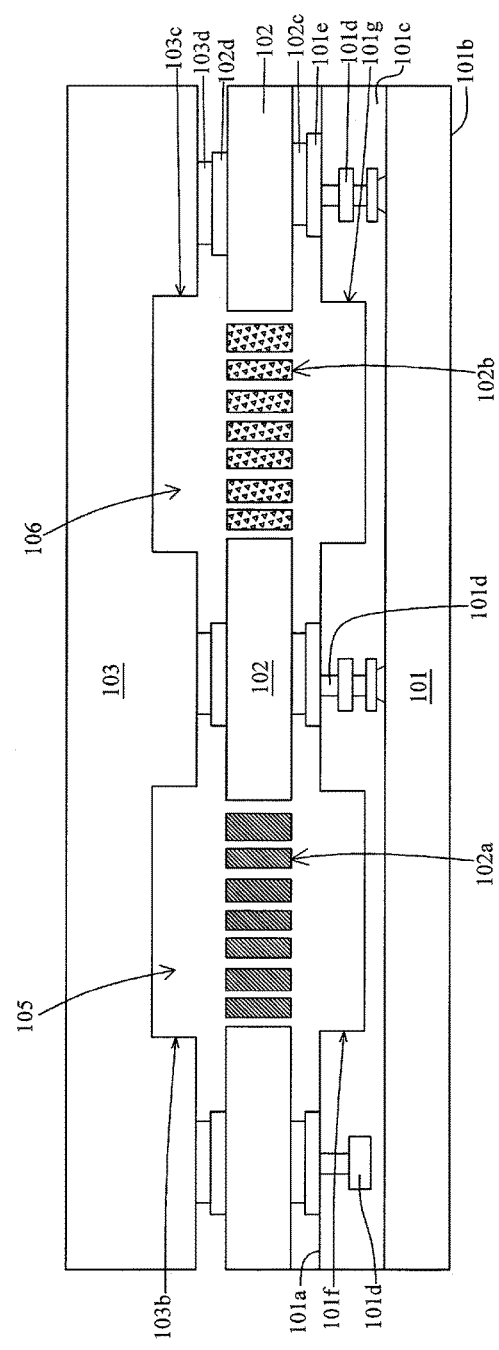
FIG. 3H is a schematic cross-sectional view of a first capping structure bonded with a second substrate by a bonding pad in accordance with some embodiments of the present disclosure.

In operation 304, a first capping structure 103 is disposed over the second substrate 102 as shown in FIG. 3G or 3H. In some embodiments, the first capping structure 103 is formed and then disposed over the second substrate 102. In some embodiments, the first capping structure 103 includes a second recess 103b and a fourth recess 103c. In some embodiments, the second recess 103b and the fourth recess 103c are formed by removing some portions of the first capping structure 103. In some embodiments, the second recess 103b and the fourth recess 103c are formed by photolithography and etching or other suitable operations.

In some embodiments, the first capping structure 103 is bonded with the second substrate 102 through fusion bonding, eutectic bonding or other suitable operations. In some embodiments as shown in FIG. 3H, the first capping structure 103 includes a fourth bonding pad 103d bonded with the third bonding pad 102d of the second substrate 102. In some embodiments, the fourth bonding pad 103d is eutectically bonded with the third bonding pad 102d. In some embodiments, a thickness of the first capping structure 103 is reduced by grinding a surface of the first capping structure 103 after disposing over the second substrate 102. In some embodiments, the surface of the first capping structure 103 is polished or planarized by suitable operations such as chemical mechanical planarization (CMP).

In some embodiments, the second recess 103b and the fourth recess 103c of the first capping structure 103 are disposed over the first device 102a and the second device 102b respectively. In some embodiments, the second recess 103b and the fourth recess 103c are disposed over the first recess 101f and the third recess 101g respectively. In some embodiments, the second recess 103b is aligned with the first device 102a and the first recess 101f, and the fourth recess 103c is aligned with the second device 102b and the third recess 101g.

In some embodiments, a first cavity 105 and a second cavity 106 are formed when the first capping structure 103 is disposed over the second substrate 102. In some embodiments, the first cavity 105 is formed and defined by the first recess 101f of the first substrate 101 and the second recess 103b of the first capping structure 103. In some embodiments, the second cavity 106 is formed and defined by the third recess 101g of the first substrate 101 and the fourth recess 103c of the first capping structure 103. In some embodiments, the first device 102a is disposed within the first cavity 105, and the second device 102b is disposed within the second cavity 106. In some embodiments, the first cavity 105 is insulated from the second cavity 106.

In some embodiments, the first device 102a and the second device 102b disposed between the first capping structure 103 and the first substrate 101 are sealed at a first gas pressure when the first capping structure 103 is disposed over the second substrate 102. In some embodiments, the first device 102a is sealed within the first cavity 105 at the first gas pressure, while the second device 102b is sealed within the second cavity 106 at the first gas pressure.

In some embodiments, the first cavity 105 and the second cavity 106 are at the first gas pressure after disposing the first capping structure 103 over the second substrate 102. In some embodiments, a gas pressure in the first cavity 105 is substantially same as a gas pressure in the second cavity 106. In some embodiments, the first gas pressure is less than an atmospheric pressure, that is the first cavity 105 and the second cavity 106 are in a vacuum or a high vacuum. Thus, the first device 102a and the second device 102b are both in a vacuum or a high vacuum after disposing the first capping structure 103.

Figure 3I:
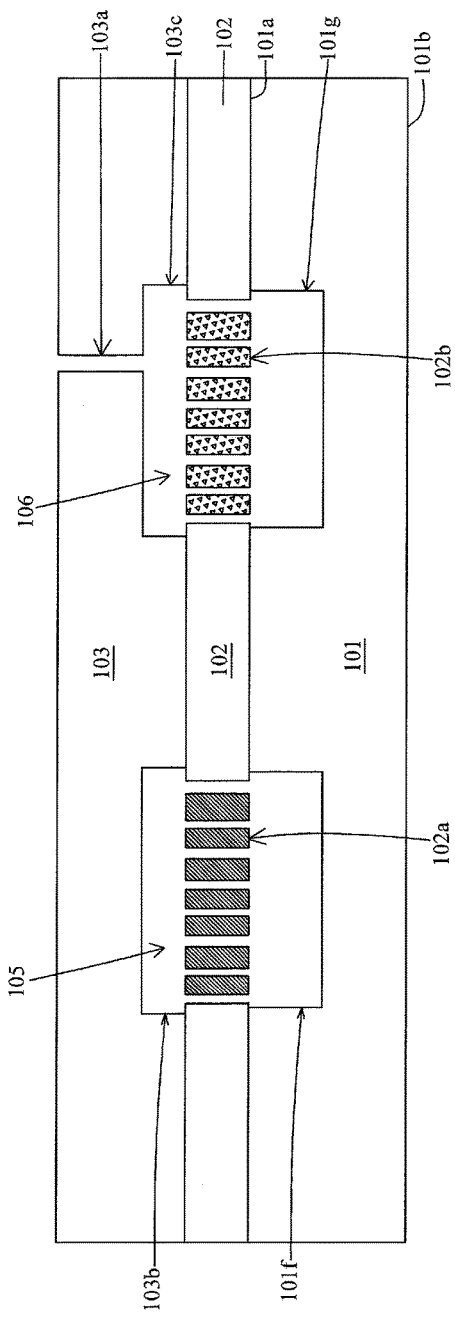
FIG. 3I is a schematic cross-sectional view of a first capping structure with a via in accordance with some embodiments of the present disclosure.
Figure 3J:
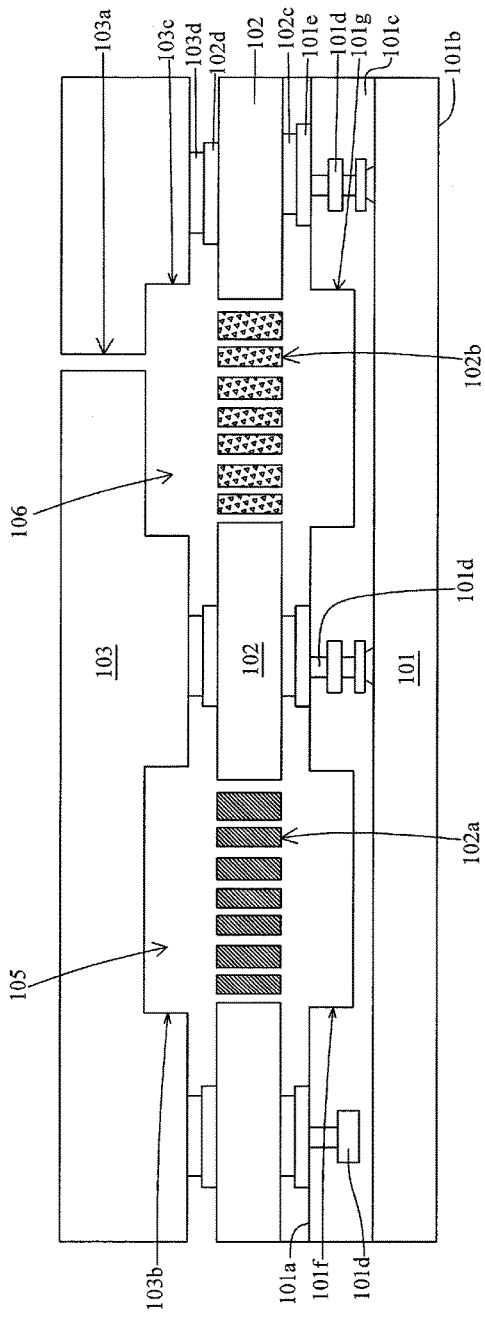
FIG. 3J is a schematic cross-sectional view of a first capping structure with a via in accordance with some embodiments of the present disclosure.

In operation 305, a via 103a is formed as shown in FIG. 3I or 3J. In some embodiments, the via 103a is formed within the first capping structure 103. In some embodiments, the via 103a is extended through the first capping structure 103 to the second device 102b. In some embodiments, the via 103a is coupled with a sidewall of the second cavity 106 or the fourth recess 103c. In some embodiments, the via 103a is formed by removing some portions of the first capping structure 103 disposed over the second cavity 106, the second device 102b, the third recess 101g or the fourth recess 103c. In some embodiments, the via 103a is formed by photolithography and etching or other suitable operations.

After the formation of the via 103a, the second cavity 106 can communicate with an ambient environment surrounding the first capping structure 103 and the first substrate 101 through the via 103a. That is, a gas diffusion is allowed to occur through the via 103a between the ambient environment and the second cavity 106. As a result, the second cavity 106 is no longer at the first gas pressure when the via 103a is formed. The formation of the via 103a would not affect the first gas pressure in the first cavity 105. The first device 102a is under the first gas pressure, regardless of the formation of the via 103a.

In some embodiments, a gas pressure of the second cavity 106 is substantially different from the first gas pressure in the first cavity 105 after the formation of the via 103a. In some embodiments, the via 103a allows a change of a gas pressure in the second cavity 106. In some embodiments, the gas pressure in the second cavity 106 is changed from the first gas pressure to a second gas pressure when the via 103a is formed. In some embodiments, the second device 102b under the first gas pressure is adjusted to the second gas pressure. In some embodiments, the second gas pressure is substantially different from the first gas pressure. Therefore, the first cavity 105 is at the first gas pressure while the second cavity 106 is at the second gas pressure when the via 103a is formed.

In some embodiments, the second cavity 106 reaches the second gas pressure when a gas diffusion between the second cavity 106 and the ambient environment reaches a steady state condition. In some embodiments, the second cavity 106 is under the second gas pressure of substantially greater than the first gas pressure in the first cavity 105. In some embodiments, the second cavity 106 is under the second gas pressure of about 1 atmospheric pressure (atm).

In some embodiments, an anti-stiction coating is disposed over the second device 102b through the via 103a. In some embodiments, the anti-stiction coating is flown through the via 103a to the second cavity 106 and coated over the second device 102b. In some embodiments, the anti-stiction coating is a self-assembled monolayer (SAM) coating. In some embodiments, the anti-stiction coating can reduce or prevent stiction between the second device 102b and the first substrate 101 or the first capping structure 103.

Figure 3K:
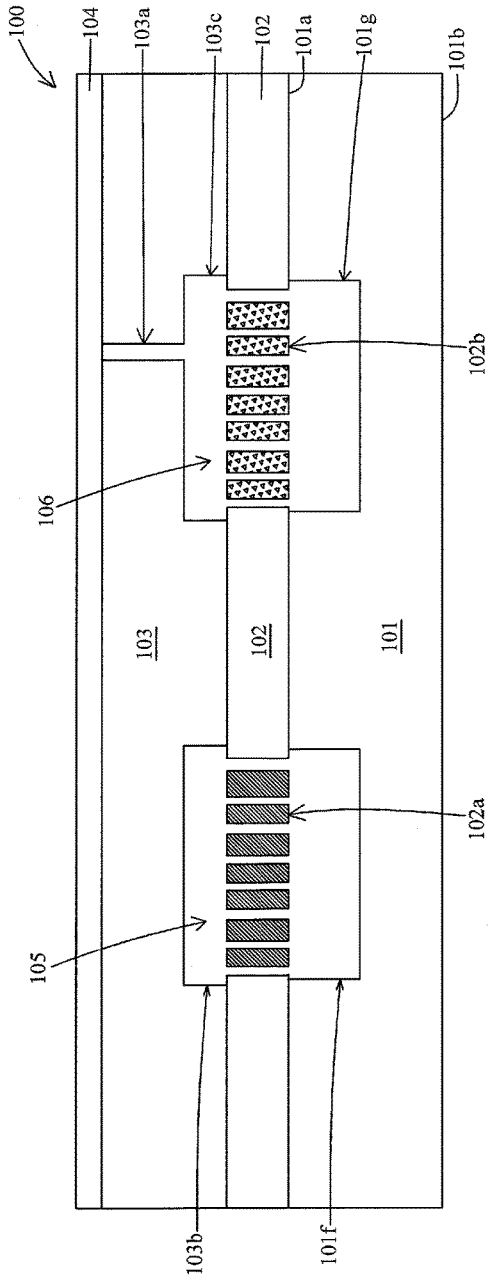
FIG. 3K is a schematic cross-sectional view of a second capping structure in accordance with some embodiments of the present disclosure.
Figure 3L:
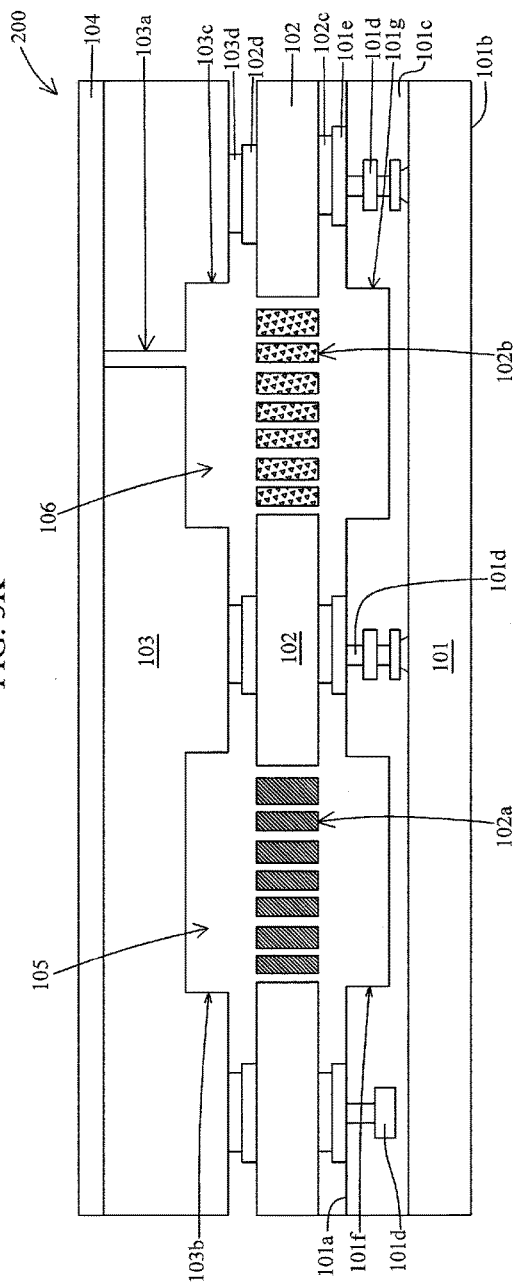
FIG. 3L is a schematic cross-sectional view of a second capping structure in accordance with some embodiments of the present disclosure.

In operation 306, a second capping structure 104 is disposed over the first capping structure 103 and the via 103a as shown in FIG. 3K or 3L. In some embodiments, the second capping structure 104 is disposed conformal to the first capping structure 103. In some embodiments, the second capping structure 104 substantially covers the first capping structure 103. In some embodiments, the second capping structure 104 has a length substantially same as a length of the first capping structure 103. In some embodiments, the second capping structure 104 is bonded with the first capping structure 103 and covers the via 103a. In some embodiments, the second capping structure 104 is polished or planarized by suitable operations such as CMP. In some embodiments, the second capping structure 104 is a silicon substrate. In some embodiments, the second capping structure 104 is bonded with the first capping structure 103 by glass frit bonding, fusion bonding, eutectic bonding or other suitable operations.

In some embodiments, a glass layer is an intermediate layer for bonding the second capping structure 104 with the first capping structure 103. In some embodiments, the glass layer is disposed between the second capping structure and the first is disposed over the second capping structure 104, then is pre-cured under a predetermined temperature, and then disposed over the first capping structure 103. In some embodiments, the glass layer is disposed over the second capping structure 104 by spin coating, screen printing or other suitable operations. In some embodiments, the second capping structure 104 is bonded with the first capping structure 103 by the glass layer under a predetermined temperature of about 300° C. to about 500° C.

In some embodiments, an oxide layer is deposited over the second capping structure 104, and then the second capping structure 104 is fused and directly bonded with the first capping structure 103 through the oxide layer. In some embodiments, the oxide layer is deposited by CVD, thermal oxidation or other suitable operations.

In some embodiments, a metal layer is disposed over the first capping structure 103 and the second capping structure 104, and then the second capping structure 104 is eutectically bonded with the first capping structure 103 through the metal layer. In some embodiments, the metal layer is disposed by CVD or other suitable operations.

After the disposition of the second capping structure 104 over the first capping structure 103, the second device 102b is under the second gas pressure substantially different from the first gas pressure. Since the via 103a permits the gas diffusion between the ambient environment and the second cavity 106 during the operation 305, the second cavity 106 is at the second gas pressure after disposing the second capping structure 104. As such, the second cavity 106 is at the second gas pressure substantially different from the first gas pressure in the first cavity 105.

After the disposition of the second capping structure 104 over the first capping structure 103, the second device 102b is under the second gas pressure, while the first device 102a is under the first gas pressure. In some embodiments, the second device 102b is under the first gas pressure when the first capping structure 103 is disposed over the second substrate 102, and then the second device 102b becomes under the second gas pressure when the second capping structure 104 is disposed over the first capping structure 103. The second device 102b under the first gas pressure is adjusted to the second gas pressure.

In some embodiments, the second capping structure 104 covers and blocks the via 103a from gas diffusion with the ambient environment, as such the second device 102b is sealed within the second cavity 106 and is under the second gas pressure after disposing the second capping structure 104 over the first capping structure 103.

In some embodiments, the disposition of the second capping structure 104 is under a predetermined gas pressure, which is substantially different from the gas pressure of the ambient environment during the operation 305, as such the second cavity 106 and the second device 102b are sealed under the predetermined gas pressure during the disposition of the second capping structure 104. As a result, the second cavity 106 is at the predetermined gas pressure and the second device 102b is under the predetermined gas pressure after the disposition of the second capping structure 104.

As a result, a semiconductive structure 100 or 200 including dual or multiple gas pressures therein is formed. The semiconductive structure 100 or 200 includes multiple devices operable under a gas pressure different from each other. In some embodiments, the first device 102a is under the first gas pressure, and the second device 102b is under the second gas pressure substantially different from the first gas pressure. For example, the first device 102a is under a vacuum while the second device 102b is under 1 atm. In some embodiments, the semiconductive structure 100 illustrated in FIG. 3K has similar configuration as in FIG. 1. In some embodiments, the semiconductive structure 200 illustrated in FIG. 3L has similar configuration as in FIG. 2.

In the present disclosure, an improved semiconductive structure is disclosed. The semiconductive structure includes a first device and a second device sealed in a first cavity and a second cavity respectively. A via is arranged to allow an adjustment of a gas pressure of the second cavity different from the first cavity during manufacturing, and a second capping structure is disposed to seal the second device in the second cavity after the adjustment. As a result, the first cavity is under a first gas pressure different from a second gas pressure in the second cavity. Thus, the first device and the second device are operated under different gas pressures. The first device and the second device can operate under their optimal conditions respectively. The performance of the semiconductive structure is improved.

In some embodiments, a semiconductive structure includes a first substrate including a first surface and a second surface opposite to the first surface, a second substrate disposed over the first surface and including a first device and a second device, a first capping structure disposed over the second substrate, and including a via extending through the first capping structure to the second device, a first cavity surrounding the first device and defined by the first capping structure and the first substrate, a second cavity surrounding the second device and defined by the first capping structure and the first substrate, and a second capping structure disposed over the first capping structure and covering the via, wherein the second cavity and the via are sealed by the second capping structure.

In some embodiments, the second capping structure is a silicon substrate. In some embodiments, the via is coupled with the second cavity and is configured to access the second cavity. In some embodiments, the first cavity is at a first gas pressure different from or substantially smaller than a second gas pressure at the second cavity. In some embodiments, the second cavity is at a second gas pressure of about 1 atmospheric pressure (atm) or an ambient environment. In some embodiments, the second capping structure has a thickness of about 10 um. In some embodiments, the via has a depth of about 50 um to about 250 um. In some embodiments, the first cavity is defined by a first recess of the first substrate and a second recess of the first capping structure, or the second cavity is defined by a third recess of the first substrate and a fourth recess of the first capping structure. In some embodiments, the first device and the second device are movable within the first cavity and the second cavity respectively. In some embodiments, the first device or the second device is a gyroscope or an accelerometer. In some embodiments, the second device is coated by an anti-stiction coating.

In some embodiments, a semiconductive structure includes a CMOS substrate, a MEMS substrate including a first MEMS device and a second MEMS device, and disposed over the CMOS substrate, a capping structure disposed over the MEMS substrate and including a via extending through the capping structure and disposed over the second MEMS device, a silicon substrate disposed over the capping structure, wherein the via is covered by the silicon substrate to seal the second MEMS device.

In some embodiments, the first MEMS device and the second MEMS device are under different gas pressures. In some embodiments, the silicon substrate is disposed over the first MEMS device and the second MEMS device. In some embodiments, the silicon substrate has a length substantially same as a length of the capping structure.

In some embodiments, a method of manufacturing a semiconductive structure includes receiving a first substrate including a first surface and a second surface opposite to the first surface, receiving a second substrate including a first device and a second device, bonding the second substrate over the first substrate, disposing a first capping structure over the second substrate, forming a via extending through the first capping structure to the second device, disposing a second capping structure over the first capping structure and the via, wherein the first device is under a first gas pressure, and the second device is under a second gas pressure, and the first gas pressure is substantially different from the second gas pressure.

In some embodiments, the disposing the first capping structure includes sealing the first device and the second device between the first capping structure and the first substrate at the first gas pressure. In some embodiments, the forming the via or the disposing the second capping structure includes adjusting the second device under the first gas pressure to the second gas pressure. In some embodiments, the disposing the second capping structure includes glass frit bonding operations, fusion bonding operations or eutectic bonding operations. In some embodiments, the method further includes disposing an anti-stiction coating over the second device through the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductive structure, comprising:
   a first substrate including a first surface and a second surface opposite to the first surface;
   a second substrate disposed over the first surface and including a first device and a second device;

a first capping structure disposed over the second substrate, and including a via extending through the first capping structure to the second device;
a first cavity surrounding the first device and defined by the first capping structure and the first substrate;
a second cavity surrounding the second device and defined by the first capping structure and the first substrate, and
a second capping structure disposed over the first capping structure and covering the via,
wherein the first cavity is sealed by the first capping structure, the second cavity and the via are sealed by the second capping structure, and the first capping structure has a length substantially same as a length of the second capping structure.

2. The semiconductive structure of claim 1, wherein the second capping structure is a silicon substrate.

3. The semiconductive structure of claim 1, wherein the via is coupled with the second cavity and is configured to access the second cavity.

4. The semiconductive structure of claim 1, wherein the first cavity is at a first gas pressure different from or substantially smaller than a second gas pressure at the second cavity.

5. The semiconductive structure of claim 1, wherein the second cavity is at a second gas pressure of about 1 atmospheric pressure (atm) or an ambient environment.

6. The semiconductive structure of claim 1, wherein the second capping structure has a thickness of about 10 um.

7. The semiconductive structure of claim 1, wherein the via has a depth of about 50 um to about 250 um.

8. The semiconductive structure of claim 1, wherein the first cavity is defined by a first recess of the first substrate and a second recess of the first capping structure, or the second cavity is defined by a third recess of the first substrate and a fourth recess of the first capping structure.

9. The semiconductive structure of claim 1, wherein the first device and the second device are movable within the first cavity and the second cavity respectively.

10. The semiconductive structure of claim 1, wherein the first device or the second device is a gyroscope or an accelerometer.

11. The semiconductive structure of claim 1, wherein the second device is coated by an anti-stiction coating.

12. A semiconductive structure, comprising:
a first substrate;
a second substrate disposed over the first substrate and including a device;
a first capping structure disposed over the second substrate and including a passage extending through the first capping structure;
a second capping structure disposed over the first capping structure; and
a cavity disposed within the first substrate and the first capping structure,
wherein the device is disposed within the cavity, the passage is connected to the cavity, the passage and the cavity are sealed by the second capping structure, an opening of the passage is in contact with the second capping structure and a sidewall of the passage is free of the second capping structure.

13. The semiconductive structure of claim 12, wherein the second capping structure is conformal to a surface of the first capping structure.

14. The semiconductive structure of claim 12, wherein the second substrate or the device is disposed between the first substrate and the first capping structure.

15. The semiconductive structure of claim 12, wherein the device is a MEMS device.

16. The semiconductive structure of claim 12, wherein the device is under a pressure of about 1 atmospheric pressure (atm) or an ambient environment.

17. A semiconductor structure, comprising:
a first substrate;
a second substrate disposed over the first substrate and including a first device and a second device;
a first capping structure disposed over the second substrate, and including a via extending through the first capping structure to the second device; and
a second capping structure disposed over the first capping structure and covering the via,
wherein the first device is sealed by the first capping structure, the second device is sealed by the second capping structure, and the first capping structure has a length substantially same as a length of the second capping structure.

18. The semiconductor structure of claim 17, wherein the second capping structure is a silicon substrate.

19. The semiconductor structure of claim 17, wherein the first device is disposed in a first cavity defined by the first substrate and the first capping structure, and the first cavity is sealed by the first capping structure.

20. The semiconductor structure of claim 17, wherein the second device is disposed in a second cavity defined by the first substrate and the first capping structure, the via is coupled to the second cavity, and the second cavity and the via are sealed by the second capping structure.

* * * * *